United States Patent
Kuan et al.

(10) Patent No.: US 11,695,089 B2
(45) Date of Patent: Jul. 4, 2023

(54) SOLAR CELL MODULES

(71) Applicant: INDUSTRIAL TECHNOLOGY RESEARCH INSTITUTE, Hsinchu (TW)

(72) Inventors: Min-Tsung Kuan, Taichung (TW); Wen-Hsien Wang, Tainan (TW); Yi-Chun Liu, Zhudong Township (TW); Hsin-Hsin Hsieh, Taipei (TW); Chiou-Chu Lai, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/731,711

(22) Filed: Dec. 31, 2019

(65) Prior Publication Data
US 2021/0202770 A1   Jul. 1, 2021

(51) Int. Cl.
*H01L 31/048* (2014.01)

(52) U.S. Cl.
CPC ................ *H01L 31/0481* (2013.01)

(58) Field of Classification Search
CPC ............. H01L 31/0481; H01L 31/048–049
See application file for complete search history.

(56) References Cited

U.S. PATENT DOCUMENTS

| | | | |
|---|---|---|---|
| 6,294,724 B1 | 9/2001 | Sasaoka et al. | |
| 8,465,675 B2 | 6/2013 | Kuan et al. | |
| 8,497,140 B2 | 7/2013 | Ol et al. | |
| 9,412,921 B2 | 8/2016 | Wang et al. | |
| 9,457,543 B2 | 10/2016 | Sollmann | |
| 9,705,020 B2 | 7/2017 | Kuan et al. | |
| 2011/0162705 A1* | 7/2011 | Popa | H01L 31/0749 136/256 |
| 2012/0204940 A1 | 8/2012 | Asanuma et al. | |
| 2012/0222723 A1 | 9/2012 | Mayer et al. | |
| 2013/0264724 A1* | 10/2013 | Telgenbuscher | H01L 21/56 257/787 |

(Continued)

FOREIGN PATENT DOCUMENTS

| | | |
|---|---|---|
| CN | 101118291 A | 2/2008 |
| CN | 102832177 A | 12/2012 |

(Continued)

OTHER PUBLICATIONS

U.S. Appl. No. 16/201,268, filed Nov. 27, 2018.

(Continued)

*Primary Examiner* — Ryan S Cannon
(74) *Attorney, Agent, or Firm* — Birch, Stewart, Kolasch & Birch, LLP

(57) ABSTRACT

A solar cell module is provided. The solar cell module includes a first substrate, a second substrate opposite the first substrate, a cell unit disposed between the first and second substrates, a first thermosetting resin layer disposed between the cell unit and the first substrate, a first thermoplastic resin layer disposed between the cell unit and the first thermosetting resin layer, a second thermosetting resin layer disposed between the cell unit and the second substrate, and a second thermoplastic resin layer disposed between the cell unit and the second thermosetting resin layer.

10 Claims, 5 Drawing Sheets

(56) References Cited

U.S. PATENT DOCUMENTS

| | | | |
|---|---|---|---|
| 2014/0373914 A1* | 12/2014 | Ninomiya | B32B 27/30 428/377 |
| 2015/0013768 A1 | 1/2015 | Odoi et al. | |
| 2015/0129018 A1* | 5/2015 | Declerck | H01L 31/049 136/251 |
| 2015/0187976 A1 | 7/2015 | Yeh et al. | |
| 2016/0336470 A1 | 11/2016 | Ogawa et al. | |
| 2016/0359064 A1 | 12/2016 | Ishiguro et al. | |
| 2018/0047863 A1* | 2/2018 | Jeon | B32B 17/10761 |
| 2018/0290439 A1 | 10/2018 | Kusudou et al. | |
| 2019/0152195 A1 | 5/2019 | Inoue | |
| 2019/0172962 A1 | 6/2019 | Lin et al. | |
| 2020/0098940 A1 | 3/2020 | Kuan et al. | |

FOREIGN PATENT DOCUMENTS

| | | |
|---|---|---|
| CN | 102884097 A | 1/2013 |
| CN | 103348459 A | 10/2013 |
| CN | 104538471 A | 4/2015 |
| CN | 103059753 B | 6/2015 |
| CN | 105646882 A | 6/2016 |
| CN | 105774154 B | 2/2018 |
| CN | 105684161 B | 10/2018 |
| CN | 109337599 A | 2/2019 |
| EP | 2 623 314 A1 | 8/2013 |
| EP | 2 732 970 B1 | 6/2015 |
| EP | 3 066 695 B1 | 12/2018 |
| FR | 2 951 187 A1 | 4/2011 |
| JP | 2002270881 A * | 9/2002 |
| JP | 2009-170890 A | 7/2009 |
| JP | WO2011/013423 A1 | 2/2011 |
| JP | 2013-7045 A | 1/2013 |
| JP | 2013-247238 A | 12/2013 |
| JP | 2015-57811 A | 3/2015 |
| JP | 2015057811 A * | 3/2015 |
| JP | 2015-522945 A | 8/2015 |
| JP | 2015-191916 A | 11/2015 |
| JP | 2017-98432 A | 6/2017 |
| TW | 200906613 A | 2/2009 |
| TW | 201134926 A | 10/2011 |
| TW | I395808 B1 | 5/2013 |
| TW | 201504312 A | 2/2015 |
| TW | I516520 B | 1/2016 |
| TW | I561385 B | 12/2016 |
| TW | I647862-SB | 1/2019 |
| TW | I679234 B | 12/2019 |
| WO | WO 2010/038875 A1 | 4/2010 |
| WO | WO 2010/058695 A1 | 5/2010 |
| WO | WO 2012/049984 A1 | 4/2012 |

OTHER PUBLICATIONS

Taiwanese Notice of Allowance and Search Report, dated Jun. 24, 2020, for Taiwanese Application No. 108148554.

Extended European Search Report for European Application No. 20216996.3, dated May 19, 2021.

Taiwanese Notice of Allowance and Search Report for Taiwanese Application No. 109145460, dated Jun. 9, 2021.

Chinese Office Action for Appl. No. 202010381199.2 dated May 25, 2022.

Chinese Office Action for Appl. No. 202011601597.7 dated Jun. 17, 2022.

U.S. Office Action for U.S. Appl. No. 17/138,198 dated Apr. 15, 2022.

Japanese Office Action for Japanese Application No. 2020-215296, dated Apr. 5, 2022, with English translation.

Office Action issued in Japanese Patent Application No. 2020-215296, dated Jan. 17, 2023.

Office Action issued in U.S. Appl. No. 17/138,198, dated Dec. 28, 2022.

* cited by examiner

SOLAR CELL MODULES

TECHNICAL FIELD

The present disclosure relates to a disassemblable and recyclable solar cell module.

BACKGROUND

With the recent growth in the popularity of solar cell modules, an increasing number of waste solar cell modules are being generated, causing problems with respect to recycling and resource reuse. In order to recover materials from used solar cell modules, the solar cell modules must first be disassembled.

In order to extend its service life of a conventional silicon solar module structure, thermosetting polymers such as ethylene vinyl acetate (EVA) or polyolefin (PO) are generally used as packaging materials, to encapsulate and fix polycrystalline or monocrystalline solar cells. Once a crosslinking network occurs among molecules of the thermosetting polymer, neither the glass nor the solar cell panel can be separated by heating and melting the packaging film. As a result, an intact glass or a complete cell panel cannot be got and reused. Therefore, the current conventional method is to smash the module into pieces and burn it, to degrade the packaging film at a high enough temperature to separate the glass from the cell module. One of the difficulties encountered when disassembling conventional silicon solar cell modules is how to remove the thermosetting plastic material so that the glass and the cells can be taken out, recycled, and reused without damaging them.

At present, there are two methods for removing thermosetting plastics. One is to decompose EVA in an acid solution or an organic solvent, and the other is to heat the silicon solar cell module at a temperature of 300° C. to 550° C. to separate the glass plate from the solar cell module. Either method is time-consuming and labor-intensive, and will cause secondary pollution. Therefore, there is an urgent need to solve the above problems by proposing a solar cell module that is easy to be disassembled and that can pass the IEC61215 electrical verification specification to achieve high-value recycling of waste modules in the industry.

Therefore, development of a disassemblable and recyclable solar cell module with efficiency is desirable.

SUMMARY

In accordance with one embodiment of the present disclosure, a solar cell module is provided. The solar cell module includes a first substrate; a second substrate opposite to the first substrate; a cell unit disposed between the first and the second substrates; a first thermosetting resin layer disposed between the cell unit and the first substrate; a first thermoplastic resin layer disposed between the cell unit and the first thermosetting resin layer; a second thermosetting resin layer disposed between the cell unit and the second substrate; and a second thermoplastic resin layer disposed between the cell unit and the second thermosetting resin layer.

A detailed description is given in the following embodiments with reference to the accompanying drawings.

DETAILED DESCRIPTION

Figure 1:
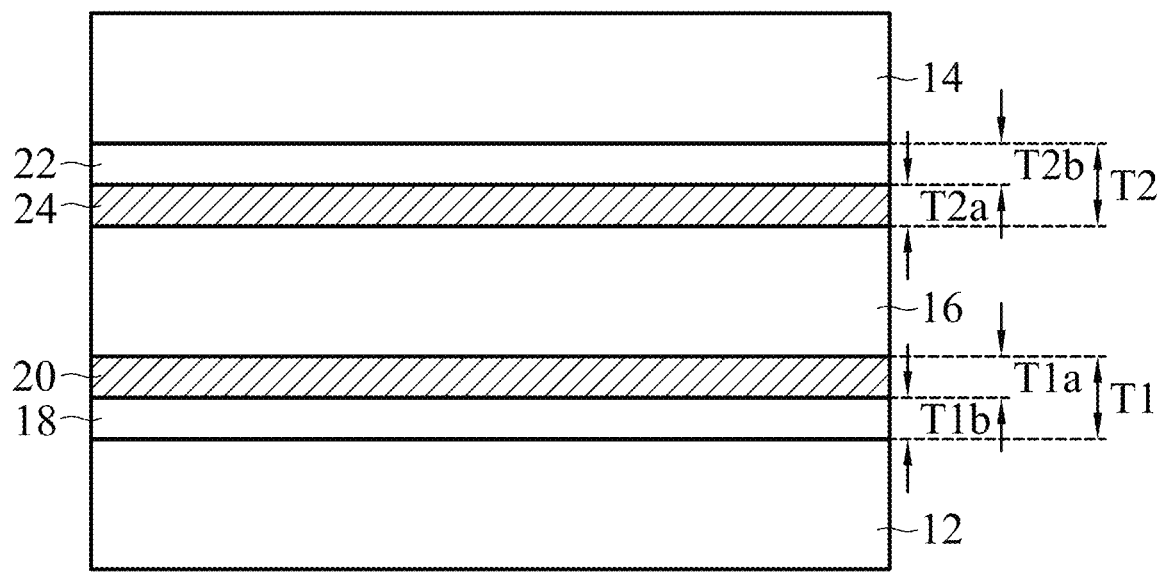
FIG. 1 shows a cross-sectional view of a solar cell module in accordance with one embodiment of the present disclosure.

Referring to FIG. 1, in accordance with one embodiment of the present disclosure, a solar cell module 10 is provided. FIG. 1 shows a cross-sectional view of the solar cell module 10.

In FIG. 1, the solar cell module 10 includes a first substrate 12, a second substrate 14, a cell unit 16, a first thermosetting resin layer 18, a first thermoplastic resin layer 20, a second thermosetting resin layer 22 and a second thermoplastic resin layer 24. The second substrate 14 is opposite to the first substrate 12. The cell unit 16 is disposed between the first substrate 12 and the second substrate 14. The first thermosetting resin layer 18 is disposed between the cell unit 16 and the first substrate 12. The first thermoplastic resin layer 20 is disposed between the cell unit 16 and the first thermosetting resin layer 18. The second thermosetting resin layer 22 is disposed between the cell unit 16 and the second substrate 14. The second thermoplastic resin layer 24 is disposed between the cell unit 16 and the second thermosetting resin layer 22. That is, in the disclosed solar cell module 10, the two sides of the cell unit 16 are in contact with the first thermoplastic resin layer 20 and the second thermoplastic resin layer 24, respectively. One side of the first thermosetting resin layer 18 is in contact with the first thermoplastic resin layer 20, and the other side of the first thermosetting resin layer 18 is in contact with the first substrate 12. One side of the second thermosetting resin layer 22 is in contact with the second thermoplastic resin layer 24, and the other side of the second thermosetting resin layer 22 is in contact with the second substrate 14.

In some embodiments, the first substrate 12 and the second substrate 14 may include glass, polyolefin resin or polyester resin, for example, polyethylene (PE), polypropylene (PP) or polyethylene terephthalate (PET).

In some embodiments, the first thermosetting resin layer 18 and the second thermosetting resin layer 22 may include an ethylene vinyl acetate (EVA) copolymer or polyolefin (PO). In some embodiments, when the first thermosetting resin layer 18 and the second thermosetting resin layer 22 include an ethylene vinyl acetate (EVA) copolymer, the weight ratio of vinyl acetate (VA) in the ethylene vinyl acetate (EVA) copolymer is in a range from about 25 wt % to about 35 wt %. In some embodiments, the thickness $T1b$ of the first thermosetting resin layer 18 and the thickness $T2b$ of the second thermosetting resin layer 22 are in a range from about 300 µm to about 2,000 µm. In some embodiments, the first thermosetting resin layer 18 and the second thermosetting resin layer 22 further include additives such as a hardening initiator, an antioxidant, a crosslinking agent, or a stabilizer. In some embodiments, the weight ratio of the additives in the first thermosetting resin layer 18 and the second thermosetting resin layer 22 is in a range from about 1 wt % to about 5 wt %.

In some embodiments, the first thermoplastic resin layer 20 and the second thermoplastic resin layer 24 may include diblock hydrogenated styrene-based resin or triblock hydrogenated styrene-based resin. In some embodiments, the first thermoplastic resin layer 20 and the second thermoplastic resin layer 24 may include, but are not limited to, the following copolymers, for example, hydrogenated (styrene-isoprene) diblock copolymers, hydrogenated (styrene-isoprene-styrene) triblock copolymers, hydrogenated (styrenebutadiene-styrene) triblock copolymers, hydrogenated (styrene-isoprene/butadiene-styrene) triblock copolymers, hydrogenated (styrene-ethylene branched isoprene) diblock copolymers, or a combination thereof. In some embodiments, the weight ratio of the styrene block in the diblock hydrogenated styrene-based resin or the triblock hydrogenated styrene-based resin is in a range from about 10 wt % to about 35 wt %.

In some embodiments, the first thermoplastic resin layer 20 and the second thermoplastic resin layer 24 may include diblock acrylic-based resin or triblock acrylic-based resin. In some embodiments, the first thermoplastic resin layer 20 and the second thermoplastic resin layer 24 may include, but are not limited to, the following copolymers, for example, poly(methylmethacrylate-b-isoprene), poly(methylmethacrylate-b-butadiene), poly(methylmethacrylate-b-isoprene-b-methylmethacrylate), poly(methylmethacrylate-b-butadiene-b-methylmethacrylate), poly(methylmethacrylate-b-isoprene/butadiene-b-methylmethacrylate), poly (methylmethacrylate/acrylate/methylmethacrylate), or a combination thereof. In some embodiments, the weight ratio of the methylmethacrylate (MMA) block in the diblock acrylic-based resin or the triblock acrylic-based resin is in a range from about 20 wt % to about 60 wt %. In some embodiments, the weight ratio of the methylmethacrylate (MMA) block in the diblock acrylic-based resin or the triblock acrylic-based resin is in a range from about 30 wt % to about 50 wt %.

In some embodiments, the total thickness T1 of the first thermosetting resin layer 18 and the first thermoplastic resin layer 20 is in a range from about 0.3 mm to about 2.0 mm. In some embodiments, the ratio of the thickness T1a of the first thermoplastic resin layer 20 and the thickness T1b of the first thermosetting resin layer 18 is in a range from about 1:0.59 to about 1:10. In some embodiments, the ratio of the thickness T1a of the first thermoplastic resin layer 20 and the thickness T1b of the first thermosetting resin layer 18 is in a range from about 1:1 to about 1:2. In some embodiments, the total thickness T2 of the second thermosetting resin layer 22 and the second thermoplastic resin layer 24 is in a range from about 0.3 mm to about 2.0 mm. In some embodiments, the ratio of the thickness T2a of the second thermoplastic resin layer 24 and the thickness T2b of the second thermosetting resin layer 22 is in a range from about 1:0.59 to about 1:10. In some embodiments, the ratio of the thickness T2a of the second thermoplastic resin layer 24 and the thickness T2b of the second thermosetting resin layer 22 is in a range from about 1:1 to about 1:2.

In some embodiments, the glass transition temperature of the first thermoplastic resin layer 20 and the second thermoplastic resin layer 24 is in a range from about 15° C. to about –20° C. In some embodiments, the glass transition temperature of the first thermoplastic resin layer 20 and the second thermoplastic resin layer 24 is in a range from about 10° C. to about –50° C. In some embodiments, the melt flow index of the first thermoplastic resin layer 20 and the second thermoplastic resin layer 24 is in a range from about 1.0 to about 31.0. In some embodiments, the hardness (type A) of the first thermoplastic resin layer 20 and the second thermoplastic resin layer 24 is in a range from about 30 to about 90. In some embodiments, the hardness (type A) of the first thermoplastic resin layer 20 and the second thermoplastic resin layer 24 is in a range from about 35 to about 80.

Specifically, after the disclosed solar cell module 10 is tested for weather resistance, the solar cell module 10 is further disassembled by, for example, a thermal dissociation method or a chemical dissociation method. In some embodiments, in the thermal dissociation method, the solar cell module 10 is disassembled by baking at a temperature of 450° C. In some embodiments, in the chemical dissociation method, the solar cell module 10 is disassembled by soaking in a solvent at a temperature below 40° C. In some embodiments, the solvent used in the chemical dissociation method may include hydrocarbon solvents such as toluene, 2-toluene, hexane, or cyclohexane.

In the disclosed solar cell module, the thermoplastic resin layer is added between the cell unit and the conventional thermosetting packaging material layer, and its material may include diblock or triblock hydrogenated styrene-based resin, or diblock or triblock acrylic-based resin. The structural design will enable the cell module to have characteristics of high light transmittance, low water absorption, high insulation and weather resistance, and resistance to PID, humidity, heat, and UV, so to meet the needs of cell modules. Also, the cell modules can be easily disassembled and recycled by simple thermal dissociation method or chemical dissociation method.

Example 1

The Physical Property Test of the Solar Cell Module (the Thermoplastic Resin Layer was Hydrogenated Styrene-Based Resin with Thickness of 200 μm)

In this example, the physical property tests were performed on the solar cell module 10 as shown in FIG. 1. In the module structure, the materials and dimensions of related components are described below: The first substrate (back plate) 12 was a solar back plate with a thickness of about 0.31 mm. The second substrate (front plate) 14 was transparent glass with a thickness of about 3.2 mm. The thickness of the cell unit 16 was about 180 μm. The first thermosetting resin layer 18 was an ethylene vinyl acetate (EVA) copolymer (EF2N; purchased from SKC Co. Ltd.) with a thickness of about 400 μm. The first thermoplastic resin layer 20 was a hydrogenated (styrene-butadiene-styrene) triblock copolymer (SEBS) (purchased from Asahi chemical Co. Ltd. S.O.E.™ S1611; glass transition temperature: 9° C.; melt flow index: 4 g/10 min (190° C.; 2.16 kgf)) with a thickness of about 292 μm. The second thermosetting resin layer 22 was an ethylene vinyl acetate (EVA) copolymer (EF2N; purchased from SKC Co. Ltd.) with a thickness of about 400 μm. The second thermoplastic resin layer 24 was a hydrogenated (styrene-butadiene-styrene) triblock copolymer (SEBS) (purchased from Asahi chemical Co. Ltd. S.O.E.™ S1611; glass transition temperature: 9° C.; melt flow index: 4 g/10 min (190° C.; 2.16 kgf)) with a thickness of about 292 μm. The total thickness T1 of the first thermosetting resin layer 18 and the first thermoplastic resin layer 20 was approximately 692±3 μm. The total thickness T2 of the second thermosetting resin layer 22 and the second thermoplastic resin layer 24 was approximately 692±3 μm. The following physical property tests were performed on the solar cell module 10, including, total light transmittance (%), haze (%), yellowness index (YI), water vapor transmission rate (WVTR) (g/m$^2$-day), tensile strength at break (MPa), peeling strength (N) and volume resistance (VR) (Ω·cm), and the test results are shown in Table 1.

Example 2

The Physical Property Test of the Solar Cell Module (the Thermoplastic Resin Layer was Hydrogenated Styrene-Based Resin with Thickness of 400 μm)

In this example, the physical property tests were performed on the solar cell module 10 as shown in FIG. 1. In the module structure, the materials and dimensions of related components are described below: The first substrate (back plate) 12 was a solar back plate with a thickness of about 0.31 mm. The second substrate (front plate) 14 was transparent glass with a thickness of about 3.2 mm. The thickness of the cell unit 16 was about 180 μm. The first thermosetting resin layer 18 was an ethylene vinyl acetate (EVA) copolymer (EF2N; purchased from SKC Co. Ltd.) with a thickness of about 400 μm. The first thermoplastic resin layer 20 was a hydrogenated (styrene-butadiene-styrene) triblock copolymer (SEBS) (purchased from Asahi chemical Co. Ltd. S.O.E.™ S1611; glass transition temperature: 9° C.; melt flow index: 4 g/10 min (190° C.; 2.16 kgf)) with a thickness of about 511 μm. The second thermosetting resin layer 22 was an ethylene vinyl acetate (EVA) copolymer (EF2N; purchased from SKC Co. Ltd.) with a thickness of about 400 μm. The second thermoplastic resin layer 24 was a hydrogenated (styrene-butadiene-styrene) triblock copolymer (SEBS) (purchased from Asahi chemical Co. Ltd. S.O.E.™ S1611; glass transition temperature: 9° C.; melt flow index: 4 g/10 min (190° C.; 2.16 kgf)) with a thickness of about 511 μm. The total thickness T1 of the first thermosetting resin layer 18 and the first thermoplastic resin layer 20 was approximately 911±3 μm. The total thickness T2 of the second thermosetting resin layer 22 and the second thermoplastic resin layer 24 was approximately 911±3 μm. The following physical property tests were performed on the solar cell module 10, including, total light transmittance (%), haze (%), yellowness index (YI), water vapor transmission rate (WVTR) (g/m$^2$-day), tensile strength at break (MPa), peeling strength (N) and volume resistance (VR) (Ω·cm), and the test results are shown in Table 1.

Example 3

The Physical Property Test of the Solar Cell Module (the Thermoplastic Resin Layer was Acrylic-Based Resin)

In this example, the physical property tests were performed on the solar cell module 10 as shown in FIG. 1. In the module structure, the materials and dimensions of related components are described below: The first substrate (back plate) 12 was a solar back plate with a thickness of about 0.31 mm. The second substrate (front plate) 14 was transparent glass with a thickness of about 3.2 mm. The thickness of the cell unit 16 was about 180 μm. The first thermosetting resin layer 18 was an ethylene vinyl acetate (EVA) copolymer (EF2N; purchased from SKC Co. Ltd.) with a thickness of about 400 μm. The first thermoplastic resin layer 20 was a triblock acrylic-based resin (LA2140; purchased from KURARAY Co. Ltd.; melt flow index: 31 g/10 min (190° C.; 2.16 kgf)) with a thickness of about 320 μm. The second thermosetting resin layer 22 was an ethylene vinyl acetate (EVA) copolymer (EF2N; purchased from SKC Co. Ltd.) with a thickness of about 400 μm. The second thermoplastic resin layer 24 was a triblock acrylic-based resin (LA2140; purchased from KURARAY Co. Ltd.; melt flow index: 31 g/10 min (190° C.; 2.16 kgf)) with a thickness of about 320 μm. The total thickness T1 of the first thermosetting resin layer 18 and the first thermoplastic resin layer 20 was approximately 720 μm. The total thickness T2 of the second thermosetting resin layer 22 and the second thermoplastic resin layer 24 was approximately 720 μm. The following physical property tests were performed on the solar cell module 10, including, total light transmittance (%), haze (%), yellowness index (YI), water vapor transmission rate (WVTR) (g/m$^2$-day), tensile strength at break (MPa), peeling strength (N) and volume resistance (VR) (Ω·cm), and the test results are shown in Table 1.

Comparative Example 1

The Physical Property Test of the Solar Cell Module (Only EVA Package)

In this comparative example, the physical property tests were performed on the specific solar cell module (the thermosetting resin layer was in contact with the cell unit and the substrate simultaneously). In the module structure, the materials and dimensions of related components are described below: The first substrate (back plate) was a solar back plate with a thickness of about 0.31 mm. The second substrate (front plate) was transparent glass with a thickness of about 3.2 mm. The thickness of the cell unit was about 180 μm. The first thermosetting resin layer was an ethylene vinyl acetate (EVA) copolymer (EF2N; purchased from SKC Co. Ltd.) with a thickness of about 400 μm. The second thermosetting resin layer was an ethylene vinyl acetate (EVA) copolymer (EF2N; purchased from SKC Co. Ltd.) with a thickness of about 400 μm. The following physical property tests were performed on the solar cell module, including, total light transmittance (%), haze (%), yellowness index (YI), water vapor transmission rate (WVTR) (g/m$^2$-day), tensile strength at break (MPa), peeling strength (N) and volume resistance (VR) (Ω·cm), and the test results are shown in Table 1.

Comparative Example 2

The Physical Property Test of the Solar Cell Module (Only PO Package)

In this comparative example, the physical property tests were performed on the specific solar cell module (the thermosetting resin layer was in contact with the cell unit and the substrate simultaneously). In the module structure, the materials and dimensions of related components are described below: The first substrate (back plate) was a solar back plate with a thickness of about 0.31 mm. The second substrate (front plate) was transparent glass with a thickness of about 3.2 mm. The thickness of the cell unit was about 180 μm. The first thermosetting resin layer was polyolefin (PO) (TF4; purchased from HANGZHOU FIRST APPLIED MATERIAL CO. LTD.) with a thickness of about 400 μm. The second thermosetting resin layer was polyolefin (PO) (TF4; purchased from HANGZHOU FIRST APPLIED MATERIAL CO. LTD.) with a thickness of about 400 μm. The following physical property tests were performed on the solar cell module, including, total light transmittance (%), haze (%), yellowness index (YI), water vapor transmission rate (WVTR) (g/m$^2$-day), tensile strength at break (MPa), peeling strength (N) and volume resistance (VR) (Ω·cm), and the test results are shown in Table 1.

Comparative Example 3

The Physical Property Test of the Solar Cell Module (Only SEBS Package)

In this comparative example, the physical property tests were performed on the specific solar cell module (the thermoplastic resin layer was in contact with the cell unit and the substrate simultaneously). In the module structure, the materials and dimensions of related components are described below: The first substrate (back plate) was a solar back plate with a thickness of about 0.31 mm. The second substrate (front plate) was transparent glass with a thickness of about 3.2 mm. The thickness of the cell unit was about 180 μm. The first thermoplastic resin layer was a hydrogenated (styrene-butadiene-styrene) triblock copolymer (SEBS) (purchased from Asahi chemical Co. Ltd. S.O.E.™ S1611; glass transition temperature: 9° C.; melt flow index: 4 g/10 min (190° C.; 2.16 kgf)) with a thickness of about 424 μm. The second thermoplastic resin layer was a hydrogenated (styrene-butadiene-styrene) triblock copolymer (SEBS) (purchased from Asahi chemical Co. Ltd. S.O.E.™ S1611; glass transition temperature: 9° C.; melt flow index: 4 g/10 min (190° C.; 2.16 kgf)) with a thickness of about 424 μm. The following physical property tests were performed on the solar cell module, including, total light transmittance (%), haze (%), yellowness index (YI), water vapor transmission rate (WVTR) (g/m²-day), tensile strength at break (MPa), peeling strength (N) and volume resistance (VR) (Ω·cm), and the test results are shown in Table 1.

Comparative Example 4

The Physical Property Test of the Solar Cell Module (EVA and SEBS Hybrid Package)

In this comparative example, the physical property tests were performed on the specific solar cell module (the mixed resin layer of EVA and SEBS was in contact with the cell unit and the substrate simultaneously). In the module structure, the materials and dimensions of related components are described below: The first substrate (back plate) was a solar back plate with a thickness of about 0.31 mm. The second substrate (front plate) was transparent glass with a thickness of about 3.2 mm. The thickness of the cell unit was about 180 μm. The first resin layer was a mixed layer of an ethylene vinyl acetate (EVA) copolymer (KA40; purchased from The Polyolefin Company) and a hydrogenated (styrene-butadiene-styrene) triblock copolymer (SEBS) (purchased from Asahi chemical Co. Ltd. S.O.E.™ S1611; glass transition temperature: 9° C.; melt flow index: 4 g/10 min (190° C.; 2.16 kgf)) with a thickness of about 400 μm. The second resin layer was a mixed layer of an ethylene vinyl acetate (EVA) copolymer (KA40; purchased from The Polyolefin Company) and a hydrogenated (styrene-butadiene-styrene) triblock copolymer (SEBS) (purchased from Asahi chemical Co. Ltd. S.O.E.™ S1611; glass transition temperature: 9° C.; melt flow index: 4 g/10 min (190° C.; 2.16 kgf)) with a thickness of about 400 μm. The following physical property tests were performed on the solar cell module, including, total light transmittance (%), haze (%), yellowness index (YI), water vapor transmission rate (WVTR) (g/m²-day), tensile strength at break (MPa), peeling strength (N) and volume resistance (VR) (Ω·cm), and the test results are shown in Table 1.

TABLE 1

| | Example 1 | Example 2 | Example 3 | Com. Example 1 | Com. Example 2 | Com. Example 3 | Com. Example 4 |
|---|---|---|---|---|---|---|---|
| Packaging materials | EVA/ SEBS | EVA/ SEBS | EVA/ Acrylic-based resin | Thermosetting EVA | Thermosetting PO | Thermoplastic SEBS | EVA and SEBS hybrid |
| Thickness ($T_1$) (μm) | 692 ± 3 | 911 ± 3 | 720 | 400 | 400 | 424 | 400 |
| Total light transmittance (%) | 87.6 | 87.4 | 87.84 | 88.4 | 88.9 | 88.3 | 54.97 |
| Haze (%) | 3.89 | 4.32 | 2.68 | 0.929 | 5.39 | 1.85 | 99.5 |
| Yellowness index | −0.01 | 0.1 | 0.02 | 0.11 | 0.14 | 0.32 | 14.65 |
| Water vapor transmission rate (g/m²-day) | 5.01 | 3.61 | 2.60 | 34.00 | 3.30 | 1.55 | 10.12 |
| Tensile strength at break (MPa) | 13.59 | 18.63 | 10.44 | 19 | 4.96 | 20.21 | 11.4 |
| Peeling strength (N) | 97.22 | 97.90 | 118.7 | 124.9 | 101 | 7.01 | 10.52 |
| Volume resistance (Ω · cm) | 5.63E+14 | 1.12E+15 | 4.99E+13 | 1.72E+14 | 8.65E+15 | 8.90E+15 | 2.29E+15 |
| Cell panel intact status during thermal-degradation process at 450°C | intact | intact | intact | cracks | cracks | intact | intact |

From the test results in Table 1, it can be seen that, in the disclosed solar cell modules (Examples 1-3), regardless of whether the material of the thermoplastic resin layer in the composite packaging material was hydrogenated styrene-based resin (such as SEBS) or acrylic block copolymer resin (such as acrylic block copolymer), according to the measured haze, water vapor transmission rate, and volume resistance, all of them met the requirements for the module structure to have high light transmission, low water absorption and high insulation and weather resistance.

In addition, when the thickness ratio of the thermoplastic resin layer and the thermosetting resin layer was between 1:0.59 and 1:10, the cell panel was not broken during the thermal-degradation process (Examples 1-3). When the thermal-degradation process was performed at 450° C. in comparative Examples 1 and 2, where the modules have only the thermosetting packaging film, the provided solar cell modules cracked after testing. In Comparative Example 3, where the module was packaged by the thermoplastic SEBS, the subsequent electrical PID tests of the module cannot pass the standard that power loss needs to be less than 5% due to poor adhesion to glass. Comparative Example 4 also shows that when the encapsulant film was made from two mixed resins, its light transmittance was only 54.97%, which does not meet the standard that the light transmittance of the packaging film needs to be greater than 85%. Obviously, it cannot be made into a packaging film and to be compared with the examples. However, in the disclosed solar cell modules (Examples 1-3), regardless of whether the material of the thermoplastic resin layer in the composite packaging material was hydrogenated styrene-based resin (such as SEBS) or acrylic block copolymer resin (such as acrylic block copolymer), in the process of disassembling through the thermal dissociation method, they can be disassembled successfully without cracks or not broken, which proves that the disclosed module structures had the advantage of being easy disassembled.

Example 4

The PID Test of the Solar Cell Modules

In Comparative Example 4, since the light transmittance of the film prepared by directly blending two materials was only 54.97% as shown in Table 1, which was not enough to meet the requirement that the light transmittance of the solar packaging film needs to be greater than 85%, it is not necessary to perform the potential induced degradation (PID) tests as the solar cell modules provided in Examples 1-3 and Comparative Examples 1-3. That is, the degree of the power loss of each cell module was tested under the conditions of a temperature of 85° C., a relative humidity of 85%, and an input voltage of 1,000V, and the test results are shown in Table 2 below.

TABLE 2

| | Packaging materials | Test time | $I_{SC}$ | $V_{OC}$ | FF | Impp | Vmpp | Pmpp | Power loss (%) |
|---|---|---|---|---|---|---|---|---|---|
| Example 1 | EVA/ SEBS | after packaging | 9.842 | 2.665 | 75.27 | 9.213 | 2.143 | 19.741 | |
| | | 96 hr | 9.736 | 2.666 | 75.47 | 9.102 | 2.152 | 19.591 | 0.76% |
| | | 288 hr | 9.683 | 2.665 | 75.44 | 9.038 | 2.154 | 19.465 | 1.40% |
| Example 2 | EVA/ SEBS | after packaging | 9.816 | 2.660 | 75.25 | 9.198 | 2.136 | 19.648 | |
| | | 96 hr | 9.677 | 2.662 | 75.36 | 9.068 | 2.141 | 19.410 | 1.21% |
| | | 288 hr | 9.640 | 2.664 | 75.60 | 9.021 | 2.152 | 19.413 | 1.20% |
| Example 3 | EVA/ Acrylic-based resin | after packaging | 2.66 | 9.64 | 2.16 | 9.16 | 77.04 | 19.756 | |
| | | 96 hr | 2.67 | 9.57 | 2.16 | 9.07 | 77.01 | 19.555 | 1.02% |
| | | 288 hr | 2.66 | 9.53 | 2.15 | 9.01 | 76.37 | 19.359 | 2.01% |
| Com. Example 1 | Thermo-setting EVA | after packaging | 9.814 | 2.652 | 74.66 | 9.137 | 2.127 | 19.431 | |
| | | 96 hr | 9.700 | 2.653 | 74.28 | 9.001 | 2.123 | 19.113 | 1.64% |
| | | 288 hr | 9.695 | 2.655 | 73.99 | 8.962 | 2.125 | 19.047 | 1.98% |
| Com. Example 2 | Thermo-setting PO | after packaging | 8.977 | 2.544 | 71.089 | 8.274 | 1.962 | 16.232 | |
| | | 96 hr | 8.961 | 2.539 | 70.852 | 8.287 | 1.946 | 16.123 | 0.672% |
| | | 288 hr | 8.961 | 2.539 | 70.135 | 8.421 | 1.895 | 15.956 | 1.700% |
| Com. Example 3 | Thermo-plastic SEBS | after packaging | 8.892 | 2.528 | 70.727 | 8.217 | 1.935 | 15.897 | |
| | | 96 hr | 8.857 | 2.525 | 69.715 | 8.286 | 1.881 | 15.590 | 1.933 |
| | | 288 hr | 8.838 | 2.522 | 60.417 | 7.866 | 1.712 | 13.469 | 15.271 |
| Com. Example 4 | EVA and SEBS hybrid | after packaging | — | — | — | — | — | — | — |
| | | 96 hr | — | — | — | — | — | — | — |
| | | 288 hr | — | — | — | — | — | — | — |

From the test results in Table 2, it can be seen that, in the disclosed solar cell modules (Examples 1-3), regardless of whether the material of the thermoplastic resin layer in the composite packaging material was hydrogenated styrene-based resin (such as SEBS) or acrylic block copolymer resin (such as acrylic block copolymer), according to the measured data of the power loss (after 96 hr or 288 hr), it has been proved that adding the thermoplastic resin layer will not reduce the efficiency of the solar module.

Example 5

The Humidity-Heat Aging Test of the Solar Cell Module

The humidity-heat aging test was performed on the solar cell module provided in Example 1. That is, the degree of the power loss of the cell module was tested under the conditions of a temperature of 85° C., a relative humidity of 85%, and a period of 1,000 hr, and the test results are shown in Table 3 below.

TABLE 3

The humidity-heat aging test

| Packaging materials | Test time | Voc_K (V) | Isc_K (A) | Vmp_K (V) | Imp_K (A) | Pmax_K (W) | FF (%) | ΔPmax (W) | Power loss (%) |
|---|---|---|---|---|---|---|---|---|---|
| EVA/ SEBS | after packaging | 0.633 | 9.098 | 0.505 | 8.607 | 4.345 | 75.425 | −0.082 | 1.882 |
| | 1,000 hr | 0.631 | 8.956 | 0.504 | 8.455 | 4.263 | 75.461 | | |

From the test results in Table 3, it can be seen that, in the disclosed solar cell module (Example 1), when the material of the thermoplastic resin layer in the composite packaging material was hydrogenated styrene-based resin (such as SEBS), according to the measured data of the power loss (after 1,000 hr), it has been proved that the module structure had the advantage of resisting aging caused by humidity and heat.

Example 6

The UV Aging Test of the Solar Cell Module

The UV aging test was performed on the solar cell module provided in Example 1. That is, the degree of the power loss of the cell module was tested under the condition of a cumulative UV illumination of 15 kWh/m², and the test results are shown in Table 4 below.

TABLE 4

The UV aging test

| Packaging materials | Test time | Voc_K (V) | Isc_K (A) | Vmp_K (V) | Imp_K (A) | Pmax_K (W) | FF (%) | ΔPmax (W) | Power loss (%) |
|---|---|---|---|---|---|---|---|---|---|
| EVA/ SEBS | after packaging | 0.635 | 9.050 | 0.510 | 8.483 | 4.328 | 75.341 | −0.036 | 0.833 |
| | After irradiating UV of 15 kWh/m² | 0.634 | 8.982 | 0.509 | 8.424 | 4.292 | 75.320 | | |

From the test results in Table 4, it can be seen that, in the disclosed solar cell module (Example 1), when the material of the thermoplastic resin layer in the composite packaging material was hydrogenated styrene-based resin (such as SEBS), according to the measured data of the power loss (After UV irradiation of 15 kWh/m²), it has been proved that the module structure had the advantage of resisting aging caused by irradiating UV.

Example 7

The Disassemblable Test of the Solar Cell Modules

In this example, the thermal-dissociation process was performed on the solar cell modules having the thermoplastic resin layer and the thermosetting resin layer with different thicknesses and to observe whether the solar cells were broken. At a temperature of 450° C., the solar cell modules were baked to observe whether the solar cell modules could be disassembled successfully or broken pieces were caused. The following 11 groups of solar cell modules were tested. The test results are shown in FIGS. 2A to 2K. The composition materials and film thickness of the packaging films of the 11 groups of solar cell modules are as follows:

Group 1: the thickness of the thermoplastic SEBS was 220 μm, the thickness of the thermosetting EVA was 1,040 μm, the thickness ratio of the thermoplastic SEBS and the thermosetting EVA was 1:4.73, and the total thickness was 1,260 μm.

Group 2: the thickness of the thermoplastic SEBS was 440 μm, the thickness of the thermosetting EVA was 1,040 μm, the thickness ratio of the thermoplastic SEBS and the thermosetting EVA was 1:2.36, and the total thickness was 1,480 μm.

Group 3: the thickness of the thermoplastic SEBS was 220 μm, the thickness of the thermosetting EVA was 1,560 μm, the thickness ratio of the thermoplastic SEBS and the thermosetting EVA was 1:7.09, and the total thickness was 1,780 μm.

Group 4: the thickness of the thermoplastic SEBS was 440 μm, the thickness of the thermosetting EVA was 1,560 μm, the thickness ratio of the thermoplastic SEBS and the thermosetting EVA was 1:3.55, and the total thickness was 2,000 μm.

Group 5: the thickness of the thermoplastic SEBS was 880 μm, the thickness of the thermosetting EVA was 520 μm, the thickness ratio of the thermoplastic SEBS and the thermosetting EVA was 1:0.59, and the total thickness was 1,400 μm.

Group 6: the thickness of the thermoplastic SEBS was 880 μm, the thickness of the thermosetting EVA was 1,040 μm, the thickness ratio of the thermoplastic SEBS and the thermosetting EVA was 1:1.18, and the total thickness was 1,920 μm.

Group 7: the thickness of the thermoplastic SEBS was 40 μm, the thickness of the thermosetting EVA was 400 μm, the thickness ratio of the thermoplastic SEBS and the thermosetting EVA was 1:10, and the total thickness was 440 μm.

Group 8: the thickness of the thermoplastic triblock acrylic was 250 μm, the thickness of the thermosetting EVA was 400 μm, the thickness ratio of the thermoplastic triblock acrylic and the thermosetting EVA was 1:1.6, and the total thickness was 650 μm.

Group 9: the thickness of the thermoplastic SEBS was 30 μm, the thickness of the thermosetting EVA was 400 μm, the thickness ratio of the thermoplastic SEBS and the thermosetting EVA was 1:13.33, and the total thickness was 430 μm.

Group 10: the thickness of the thermoplastic SEBS was 10 μm, the thickness of the thermosetting EVA was 400 μm, the thickness ratio of the thermoplastic SEBS and the thermosetting EVA was 1:40, and the total thickness was 410 μm.

Group 11: the thickness of the thermosetting EVA was 400 μm, and the total thickness was 400 μm.

Figure 2A:
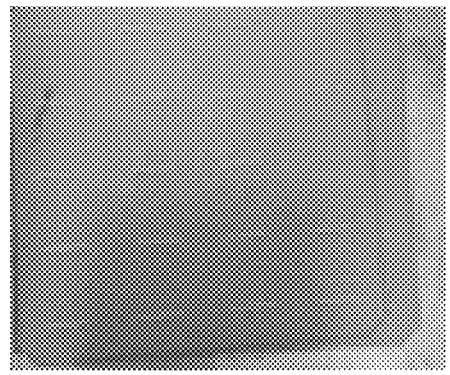
FIGS. 2A to 2K show the results of disassemblable tests of solar cell modules in accordance with one embodiment of the present disclosure.
Figure 2B:
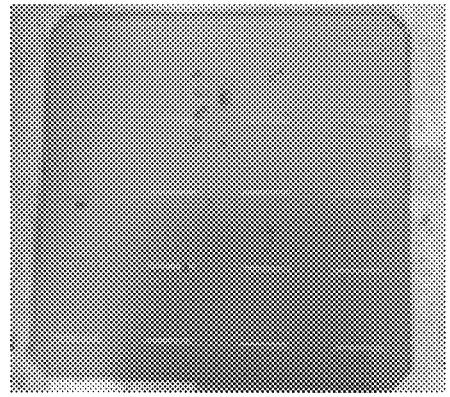
Figure 2C:
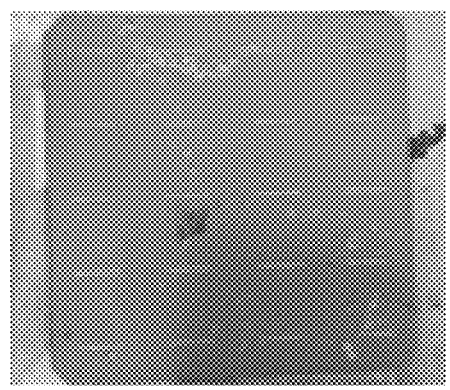
Figure 2D:
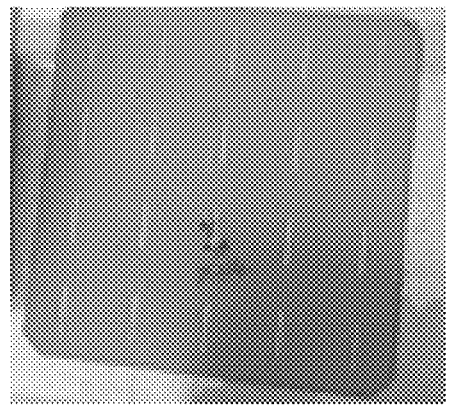
Figure 2E:
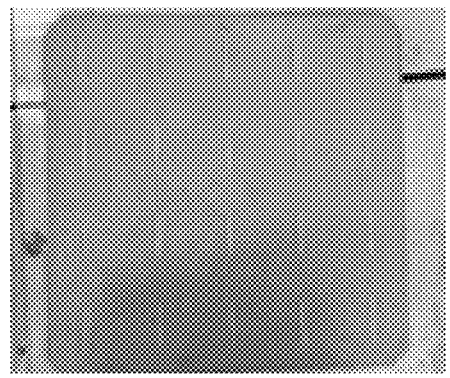
Figure 2F:
Figure 2G:
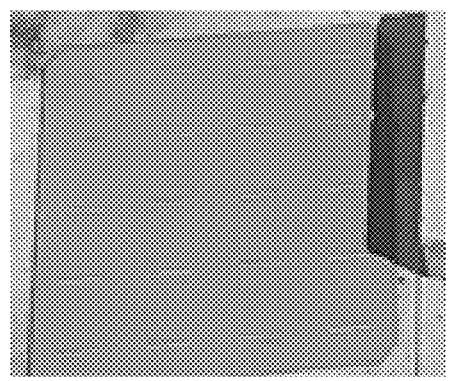
Figure 2H:
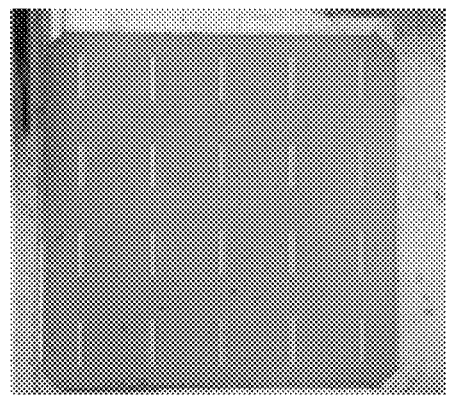
Figure 2I:
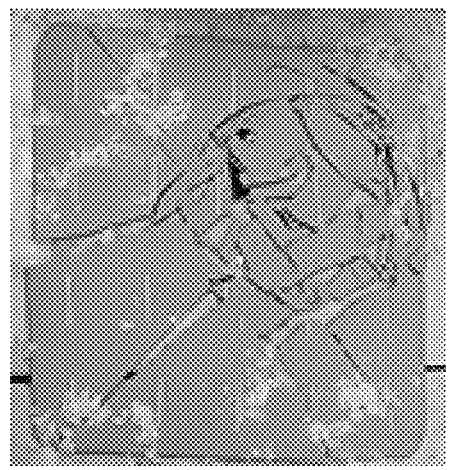
Figure 2J:
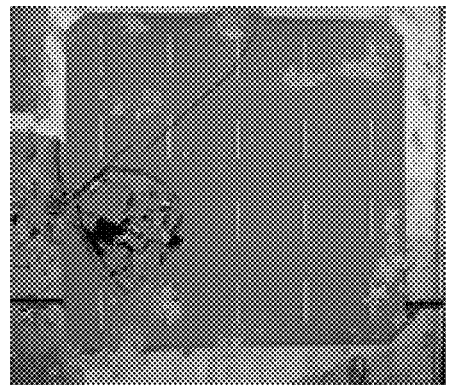
Figure 2K:
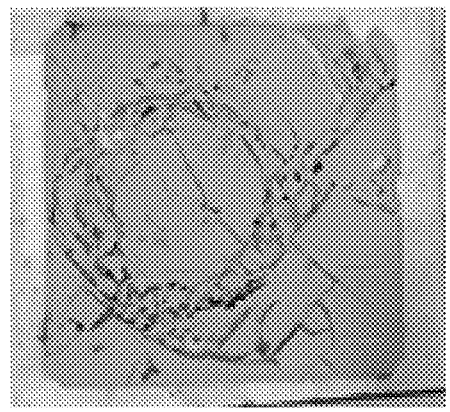

According to the test results, when the thickness ratio of the thermoplastic resin layer and the thermosetting resin layer was between 1:0.59 and 1:10, the cell panel were not broken during the thermal-degradation process (as shown in FIGS. 2A to 2H). However, when the module included only the thermosetting packaging film or the thickness ratio of the thermoplastic resin layer and the thermosetting resin layer was greater than 1:10, the cell panels were broken (as shown in FIGS. 2I to 2K).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solar cell module, comprising:
a first substrate;
a second substrate opposite to the first substrate;
a cell unit disposed between the first substrate and the second substrate;
a first thermosetting resin layer disposed between the cell unit and the first substrate;
a first thermoplastic resin layer disposed between the cell unit and the first thermosetting resin layer, wherein the first thermoplastic resin layer and the first thermosetting resin layer have a thickness ratio between 1:0.59 and 1:10;
a second thermosetting resin layer disposed between the cell unit and the second substrate; and
a second thermoplastic resin layer disposed between the cell unit and the second thermosetting resin layer, wherein the second thermoplastic resin layer and the second thermosetting resin layer have a thickness ratio between 1:0.59 and 1:10,
wherein the first thermoplastic resin layer and the second thermoplastic resin layer each have a thickness of 40-320 μm.

2. The solar cell module as claimed in claim 1, wherein the first substrate and the second substrate comprise glass, polyolefin resin or polyester resin.

3. The solar cell module as claimed in claim 1, wherein the first thermoplastic resin layer and the second thermoplastic resin layer comprise poly(methylmethacrylate-b-isoprene), poly(methylmethacrylate-b-butadiene), poly(methylmethacrylate-b-isoprene-b-methylmethacrylate), poly(methylmethacrylate-b-butadiene-b-methylmethacrylate), poly(methylmethacrylate-b-isoprene/butadiene-b-methylmethacrylate), or a combination thereof.

4. The solar cell module as claimed in claim 1, wherein the first thermoplastic resin layer and the second thermoplastic resin layer have a glass transition temperature between 15° C. and −50° C.

5. The solar cell module as claimed in claim 1, wherein the first thermoplastic resin layer and the second thermoplastic resin layer have a melt flow index between 1.0 and 31.0.

6. The solar cell module as claimed in claim 1, wherein the first thermoplastic resin layer and the second thermoplastic resin layer each have a thickness of 40 μm.

7. The solar cell module as claimed in claim 1, wherein the first thermoplastic resin layer and the second thermoplastic resin layer comprise diblock hydrogenated styrene-based resin, triblock hydrogenated styrene-based resin, diblock acrylic-based resin or triblock acrylic-based resin.

8. The solar cell module as claimed in claim 7, wherein the first thermoplastic resin layer and the second thermoplastic resin layer comprise a hydrogenated (styrene-isoprene) diblock copolymer, a hydrogenated (styrene-isoprene-styrene) triblock copolymer, a hydrogenated (styrene-butadiene-styrene) triblock copolymer, a hydrogenated (styrene-isoprene/butadiene-styrene) triblock copolymer, a hydrogenated (styrene-ethylene branched isoprene) diblock copolymer, or a combination thereof.

9. The solar cell module as claimed in claim 8, wherein a styrene block in the diblock hydrogenated styrene-based resin or the triblock hydrogenated styrene-based resin has a weight ratio between 10 wt % and 35 wt %.

10. The solar cell module as claimed in claim 1, wherein the first thermoplastic resin layer and the second thermoplastic resin layer each have a thickness of 220-320 μm.

* * * * *